United States Patent [19]
Walker et al.

[11] Patent Number: 5,352,976
[45] Date of Patent: Oct. 4, 1994

[54] MULTI-CHANNEL TRIGGER DEJITTER

[75] Inventors: George S. Walker; Eric P. Etheridge, both of Beaverton, Oreg.

[73] Assignee: Tektronix, Inc., Wilsonville, Oreg.

[21] Appl. No.: 828,827

[22] Filed: Jan. 31, 1992

[51] Int. Cl.$^5$ ............................................. G01R 25/00
[52] U.S. Cl. ............................ 324/121 R; 324/158.1; 364/487
[58] Field of Search ............... 324/158 R, 73.1, 77, 324/121 R, 83 R; 364/487, 483; 328/151

[56] References Cited

U.S. PATENT DOCUMENTS

| | | | |
|---|---|---|---|
| 4,555,765 | 11/1985 | Crooke et al. | 324/121 R |
| 4,779,045 | 10/1988 | Shark | 324/121 R |
| 4,797,936 | 1/1989 | Nakatsugawa et al. | 324/121 R |
| 4,843,309 | 6/1989 | Kareem et al. | 324/121 R |

FOREIGN PATENT DOCUMENTS 0276971  11/1990  Japan ............................... 324/121 R

*Primary Examiner*—Vinh Nguyen
*Attorney, Agent, or Firm*—Francis I. Gray

[57] ABSTRACT

A multi-channel trigger dejitter technique uses actual digitized samples from a repetitive waveform signal to correct for jitter in a hardware trigger signal. Interpolated samples are calculated between a set of the digitized samples about the hardware trigger signal, and a hardware trigger level is determined from the closest sample in time to the hardware trigger signal. The hardware trigger level is averaged with that determined from prior acquisitions to produce an average trigger level. The closest sample in time to the average trigger level becomes an averaged trigger signal, and the times for all the digitized samples for that acquisition, as well as all simultaneous acquisitions from other input channels, are adjusted according the difference in time between the hardware and averaged trigger signals. Over several acquisition iterations of the repetitive waveform the amount of jitter between acquisitions is decreased.

3 Claims, 3 Drawing Sheets (ACQ. #1)

(ACQ. #2)

(ACQ. #3)

(DEJITTER)

(NO DEJITTER)

MULTI-CHANNEL TRIGGER DEJITTER

BACKGROUND OF THE INVENTION

The present invention relates to waveform digitizing systems, and more particularly to a multi-channel trigger dejitter technique for digital sampling oscilloscopes and the like that improves the accuracy of the trigger time information for repetitive signals.

A waveform digitizing system, such as a digital sampling oscilloscope, takes discrete periodic samples of multiple analog input signals and either displays them or otherwise stores or transmits them to a remote device, such as a personal computer. If a signal is repetitive and being displayed, it is important that each iteration of the signal be displayed in the same place so that parts of the waveform that are not different do not move around and differences between subsequent iterations are readily apparent. The trigger hardware of a digital sampling device ensures that signals are always digitized in the vicinity of a particular event, such as a voltage crossing. Trigger time information is typically provided to much higher resolution than the digitizing sample interval. For example, a digital sampling oscilloscope with a digitizing sample interval of 500 picoseconds might provide trigger time resolution of ten picoseconds. This allows the display to be horizontally expanded, i.e., "zoomed", either using software interpolation, such as linear or sin(x)/x algorithms, or using equivalent time sampling where the display is filled out over multiple acquisitions. If high resolution trigger time information is not provided accurately, an interpolated display jitters back and forth and an equivalent time sampling display shows vertical noise on edges because of errors in sample time placement with respect to the trigger point.

Therefore what is desired is a multi-channel trigger dejitter technique for digitizing sampling devices that uses information contained in the digitized waveform to improve the accuracy of the trigger time information for repetitive signals.

SUMMARY OF THE INVENTION

Accordingly the present invention provides a multi-channel trigger dejitter technique that uses digitized waveform data from a trigger channel to fine-tune a trigger position in time. When the trigger occurs, the horizontal location in the trigger channel where the trigger is expected is located, and the region around the trigger is expanded horizontally. Using the "un-dejittered" location information, the digitized trigger level is extracted and averaged with prior trigger levels to get a running "average trigger" level. The expanded waveform is searched for the new average trigger level crossing point, and a time offset is computed from the un-dejittered position. The time offset is used to correct the trigger time so that when the waveforms are subsequently displayed, they are moved horizontally with respect to the trigger by the time offset.

The objects, advantages and other novel features of the present invention are apparent from the following detailed description when read in view of the appended claims and attached drawing.

DESCRIPTION OF THE PREFERRED EMBODIMENT

Figure 1:
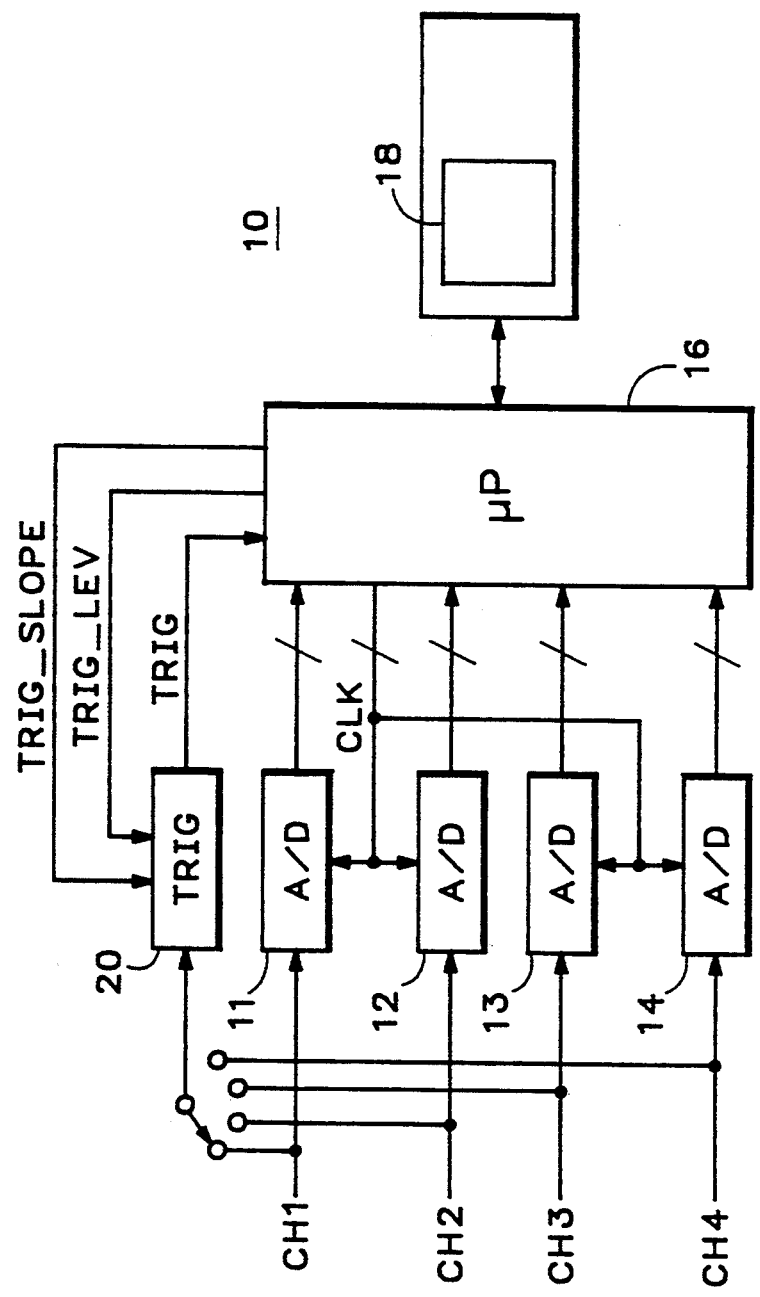
FIG. 1 is a block diagram of a typical digitizing sampling oscilloscope that uses the multi-channel trigger dejitter technique of the present invention.

Referring now to FIG. 1 a typical digitizing sampling oscilloscope 10 has multiple input channels Ch1, Ch2, Ch3, Ch4. Separate input signals are applied to each input channel and digitized by respective analog-to-digital converters 11, 12, 13, 14 according to a system clock signal CLK. The digitized samples of the input signals are input to a microprocessor system 16 for further processing. The processed waveforms are presented on an appropriate display device 18. The portions of the waveforms to be displayed are determined by a trigger signal TRIG generated from one of the input channels, Ch1 in this example. A trigger generating circuit 20 receives as inputs the waveform on the one channel and a trigger level signal TRIG_LEV and a trigger slope signal TRIG_SLOPE derived from digital signals provided by the microprocessor system 16. In response the trigger generating circuit 20 generates the trigger signal when the waveform crosses in the specified slope direction the trigger level. The portions of the waveforms displayed are determined by a time interval selected by an operator about the trigger time. Since the sampling clock signal CLK is generally asynchronous with respect to the waveforms, the trigger event may occur at any point between two consecutive samples of the sampling channel.

Figure 2:
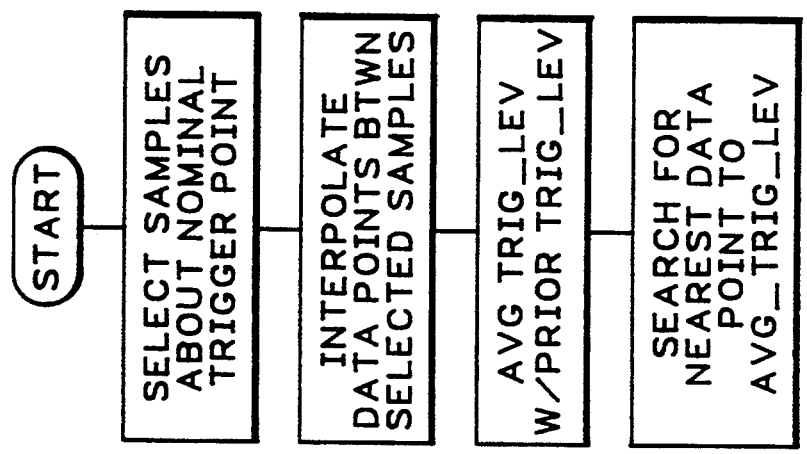
FIG. 2 is a flow chart diagram of the multi-channel trigger dejitter technique of the present invention.
Figure 3A:
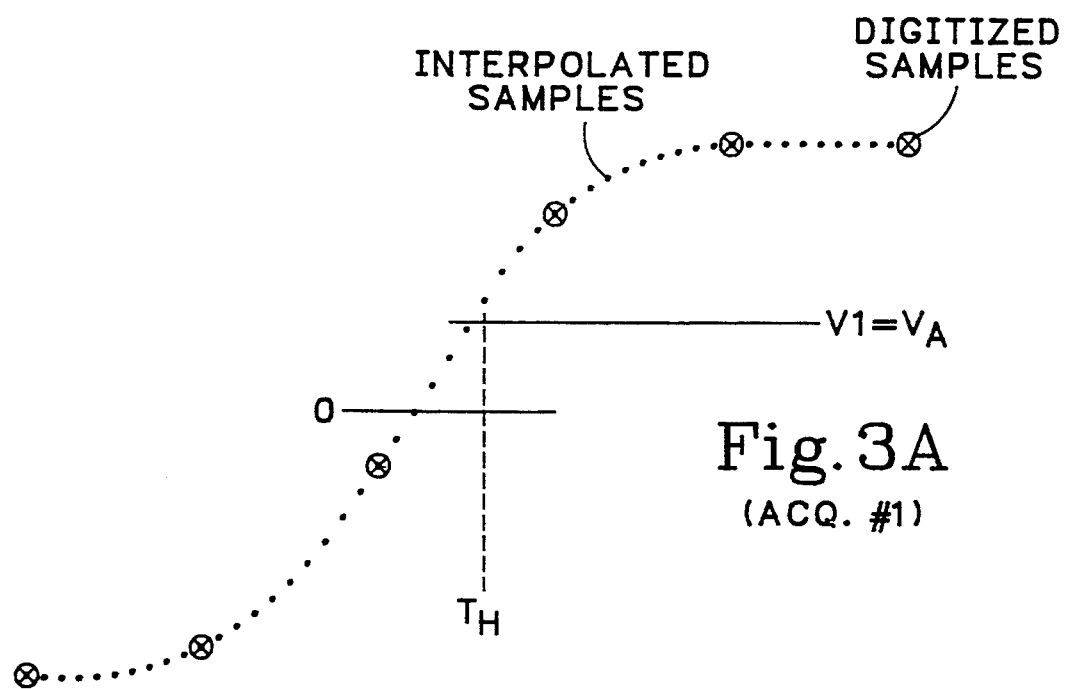
FIGS. 3a, 3b and 3c are graphical views illustrating the operation of the multi-channel trigger dejitter technique of the present invention.
Figure 3B:
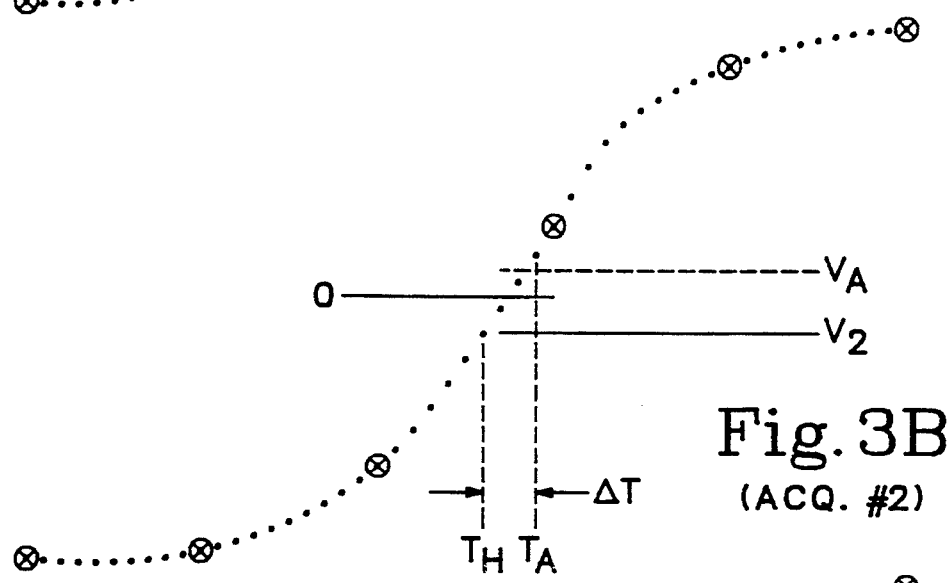
Figure 3C:
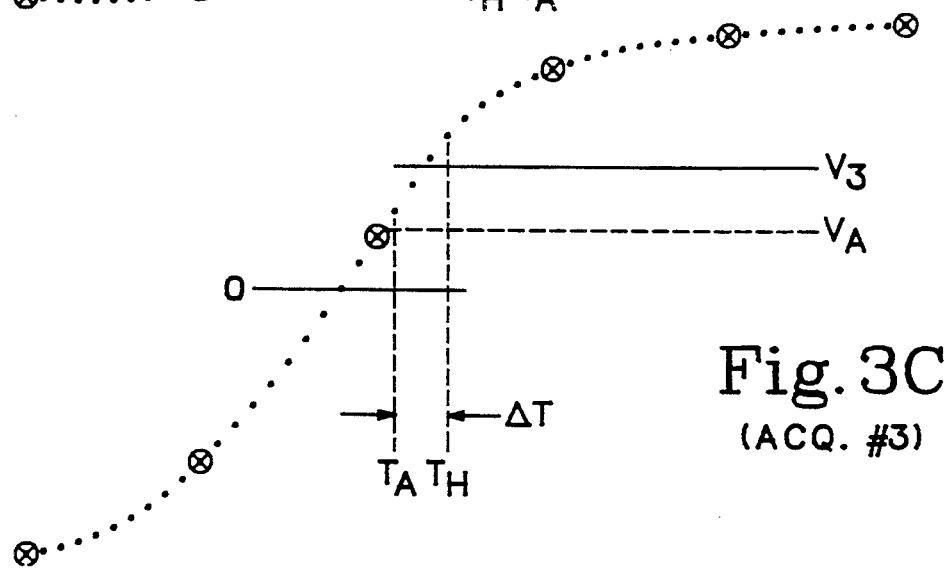

Each digitized sample has an amplitude value and a time value determined from the trigger event. Due to the fact that there is noise in the trigger path, the actual trigger level at which the trigger is generated varies, i.e., jitters. Such jitter may result in time errors of the samples by as much as one period of the instrument bandwidth. Referring now to FIG. 2 in conjunction with FIGS. 3a–3c, in response to a hardware trigger time Th generated by a first trigger level V1 during a first acquisition of a waveform, a set of digitized samples for the same channel from which the trigger signal is generated is captured immediately surrounding the hardware trigger. A set of interpolated samples is calculated between the digitized samples using an appropriate algorithm, such as a sin(x)/x algorithm. The closest sample, whether digitized or interpolated, to an average trigger level Va (Va=V1 for the first acquisition) that also has the correct slope (rising or falling) is determined to be the average trigger time Ta, and all digitized samples for all the input channels are adjusted in time according to the difference between the hardware trigger and the average trigger. For second and third acquisitions the hardware trigger levels are V2 and V3, and the trigger level for each subsequent acquisition is averaged with up to N prior trigger levels to determine the average trigger level. For each acquisition the digitized sample times are adjusted according to the difference between the hardware trigger time and the average trigger time.

Figure 4B:
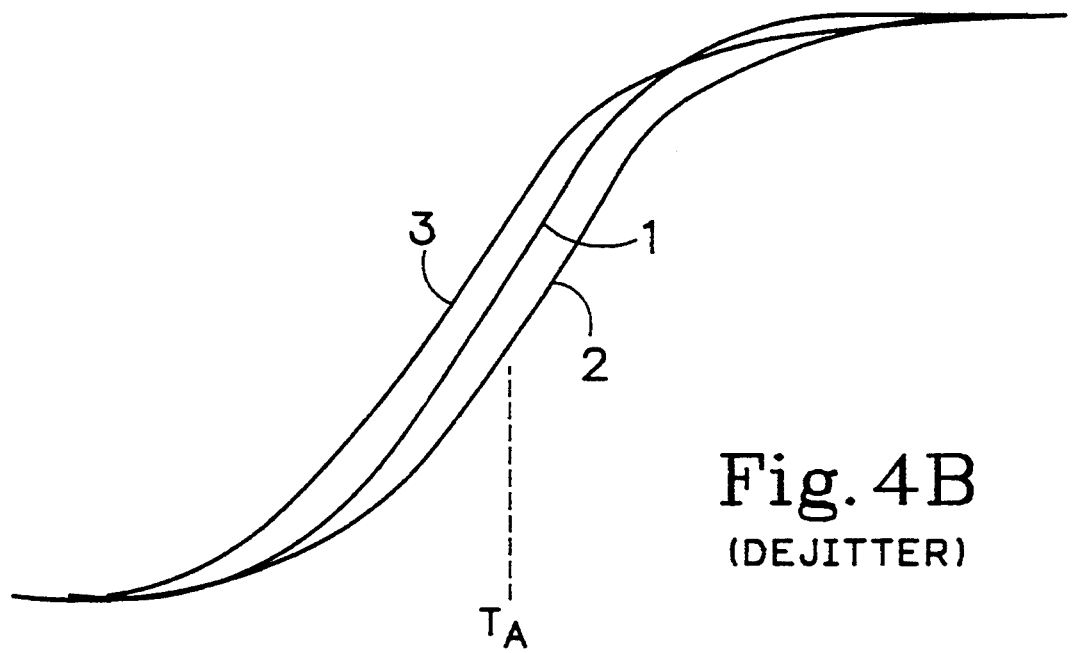
FIGS. 4a and 4b are graphical views illustrating the display of data without and with the multi-channel trigger dejitter technique of the present invention.
Figure 4A:
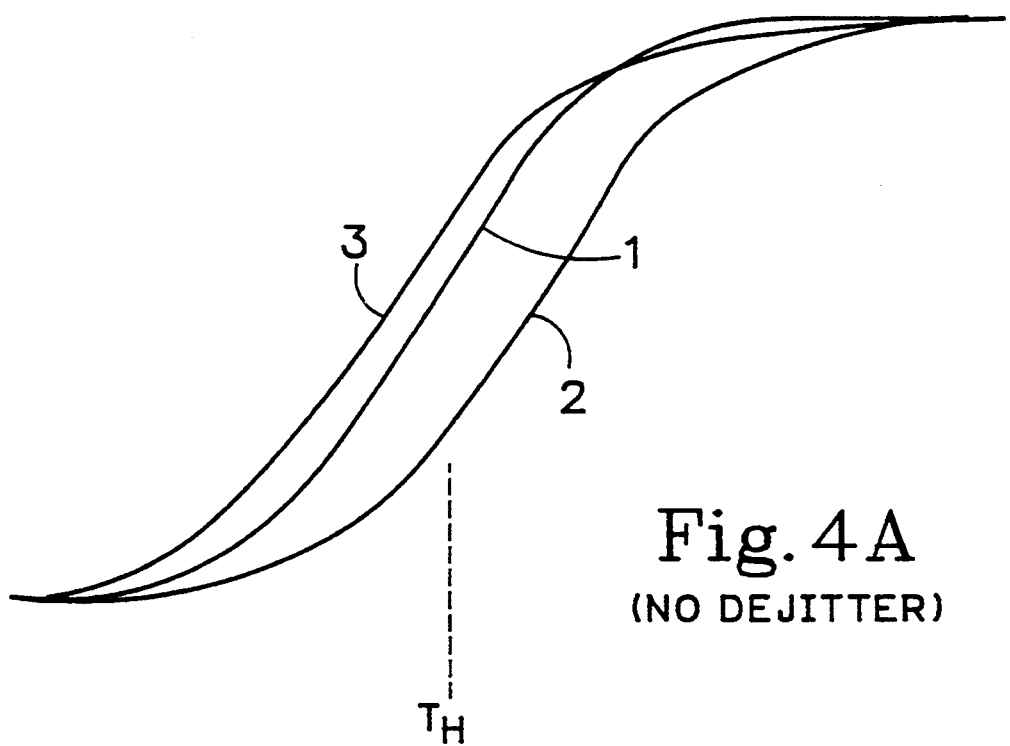

As shown in FIGS. 4a and 4b the digitized samples, when aligned in time with the hardware triggers for each acquisition have a definite spread, or jitter, between the different acquisitions. When dejitter is used, the different acquisitions are aligned in time with the average triggers, and the resulting jitter is considerably reduced. The amount of jitter reduction depends upon the number of averages N, and for a high enough N may be reduced essentially to zero.

Thus the present invention provides multi-channel trigger dejitter for repetitive waveform acquisitions by using the waveform data itself to determine the appropriate trigger point, and adjusting the digitized samples of the waveforms to an average trigger for each acquisition iteration.

What is claimed is:

1. A trigger dejitter method comprising the steps of:
   acquiring a set of digitized samples from a repetitive waveform signal about a hardware trigger signal, each digitized sample having a magnitude value and a time relative to the hardware trigger signal;
   calculating a set of interpolated samples between the digitized samples;
   determining one of the digitized and interpolated samples as a hardware trigger point corresponding to the hardware trigger signal;
   averaging the magnitude of the one sample with an average magnitude for trigger points from prior acquisitions;
   determining another of the samples as an averaged trigger point corresponding to the average magnitude; and
   adjusting the time of each digitized sample according to the difference in time between the hardware and averaged trigger points.

2. The trigger dejitter method of claim 1 further comprising reiterating the recited steps for a plurality of iterations of the waveform signal.

3. The trigger dejitter method of claim 1 further comprising the step of displaying the adjusted digitized samples to reproduce the waveform signal.

* * * * *